United States Patent
Reitsma et al.

(10) Patent No.: US 11,942,960 B2
(45) Date of Patent: Mar. 26, 2024

(54) ADC WITH PRECISION REFERENCE POWER SAVING MODE

(71) Applicant: Analog Devices, Inc., Wilmington, MA (US)

(72) Inventors: George Pieter Reitsma, Redwood City, CA (US); Karthik Pappu, Santa Clara, CA (US); Raymond Thomas Perry, South San Francisco, CA (US); Kalin v. Lazarov, Colorado Springs, CO (US); James Raymond Catt, San Jose, CA (US); Michael C. W. Coln, Lexington, MA (US)

(73) Assignee: Analog Devices, Inc., Wilmington, MA (US)

( * ) Notice: Subject to any disclaimer, the term of this patent is extended or adjusted under 35 U.S.C. 154(b) by 11 days.

(21) Appl. No.: 17/588,765

(22) Filed: Jan. 31, 2022

(65) Prior Publication Data

US 2023/0246652 A1 Aug. 3, 2023

(51) Int. Cl.
*H03M 1/10* (2006.01)
*H03M 1/00* (2006.01)

(52) U.S. Cl.
CPC ......... *H03M 1/1014* (2013.01); *H03M 1/002* (2013.01)

(58) Field of Classification Search
CPC .... H03M 1/12; H03M 1/1009; H03M 1/1215; H03M 1/1245; H03M 1/1023; H03M 1/1038; H03M 1/00; H03M 1/46; H03M 1/1019; H03M 1/468; H03M 1/10; H03M 1/1033; H03M 1/34; H03M 1/361; H03M 1/089; H03M 1/06; H03M 1/0845; H03M 1/1071

USPC ............. 341/118–121, 155, 139, 142
See application file for complete search history.

(56) References Cited

U.S. PATENT DOCUMENTS

| 5,669,713 | A | | 9/1997 | Schwartz et al. |
|---|---|---|---|---|
| 5,936,561 | A | * | 8/1999 | Lee .................. H03M 3/388 341/118 |
| 6,541,751 | B1 | | 4/2003 | Bidermann |
| 6,697,655 | B2 | | 2/2004 | Sueppel et al. |
| 6,812,777 | B2 | * | 11/2004 | Tamura ................ H03F 3/4565 327/540 |

(Continued)

FOREIGN PATENT DOCUMENTS

| CN | 107749157 | | 3/2018 |
|---|---|---|---|
| CN | 106374923 | B | 3/2020 |

(Continued)

OTHER PUBLICATIONS

"European Application Serial No. 21216605.2, Extended European Search Report dated May 16, 2022", 12 pgs.

(Continued)

*Primary Examiner* — Linh V Nguyen

(74) *Attorney, Agent, or Firm* — Schwegman Lundberg & Woessner, P.A.

(57) ABSTRACT

An analog-to-digital (ADC) converter system and method of using the system that can be used in low power situations. The converter can periodically or recurrently turn off a reference standard in order to conserve power and instead using a stable supply source as a reference voltage. A precise conversion for signal from the analog to the digital domain while maintaining a low quiescent current.

20 Claims, 4 Drawing Sheets

(56) References Cited

U.S. PATENT DOCUMENTS

| | | | |
|---|---|---|---|
| 7,046,179 B1* | 5/2006 | Taft | H03M 1/1009 341/120 |
| 7,046,180 B2* | 5/2006 | Jongsma | H03M 1/1076 341/141 |
| 7,146,283 B2 | 12/2006 | Daigle et al. | |
| 7,173,987 B2* | 2/2007 | Nishio | H04N 5/20 375/345 |
| 7,378,999 B1 | 5/2008 | Mcgrath et al. | |
| 7,427,936 B2 | 9/2008 | Takeuchi | |
| 7,623,050 B2* | 11/2009 | Le | H03M 1/1023 341/118 |
| 7,710,303 B2 | 5/2010 | Wojewoda et al. | |
| 7,738,013 B2 | 6/2010 | Galambos et al. | |
| 8,736,468 B2 | 5/2014 | Fabregas et al. | |
| 8,981,972 B2 | 3/2015 | Shen et al. | |
| 9,083,369 B2 | 7/2015 | Coln et al. | |
| 9,366,547 B2 | 6/2016 | Forsyth et al. | |
| 9,503,116 B2 | 11/2016 | Speir et al. | |
| 9,503,641 B2 | 11/2016 | Likamwa et al. | |
| 9,521,349 B2 | 12/2016 | Vogelsang et al. | |
| 9,571,115 B1* | 2/2017 | Beukema | H03M 1/1023 |
| 10,001,530 B2 | 6/2018 | Bottinelli et al. | |
| 10,061,375 B2 | 8/2018 | Brillant et al. | |
| 10,079,600 B2 | 9/2018 | Motz | |
| 10,191,505 B2 | 1/2019 | Yang et al. | |
| 10,243,577 B1 | 3/2019 | Berens et al. | |
| 10,382,048 B2 | 8/2019 | Fernando et al. | |
| 10,401,886 B1 | 9/2019 | Melanson et al. | |
| 10,528,070 B2 | 1/2020 | Coln et al. | |
| 10,763,881 B1 | 9/2020 | Nittala et al. | |
| 11,652,492 B2 | 5/2023 | Reitsma et al. | |
| 2007/0132625 A1* | 6/2007 | Chen | H03M 1/0607 341/155 |
| 2009/0228224 A1 | 9/2009 | Spanier et al. | |
| 2010/0259285 A1 | 10/2010 | Koli et al. | |
| 2011/0179868 A1 | 7/2011 | Kaino et al. | |
| 2013/0154866 A1* | 6/2013 | Fabregas | H03M 1/1019 341/158 |
| 2016/0132091 A1 | 5/2016 | Bodner et al. | |
| 2017/0238258 A1 | 8/2017 | Ramalho De Oliveira et al. | |
| 2019/0346912 A1* | 11/2019 | Bogue | G06F 1/26 |
| 2020/0057484 A1 | 2/2020 | Coln et al. | |
| 2020/0186160 A1 | 6/2020 | Kulkarni et al. | |
| 2022/0209681 A1 | 6/2022 | Reitsma et al. | |

FOREIGN PATENT DOCUMENTS

| | | |
|---|---|---|
| JP | 4301254 B2 | 7/2009 |
| JP | 2018179567 A | 11/2018 |
| WO | WO-2014144391 A1 | 9/2014 |
| WO | WO-2019079378 A1 | 4/2019 |
| WO | WO-2020002562 A1 | 1/2020 |

OTHER PUBLICATIONS

"24-Bit Analog-to-Digital Converters for Temperature Sensors", Texas Instruments Data Sheet, (Oct. 2011), 70 pgs.

"78M6612: Single-Phase, Dual-Outlet Power and Energy Measurement IC", Maxim Integrated Products Data Sheet, (2012), 46 pgs.

"ADS1220 4-Channel, 2-kSPS, Low-Power, 24-Bit ADC with Integrated PGA and Reference", Texas Instruments Data Sheet, (Aug. 2016), 74 pgs.

"ADS126x 32-Bit, Precision, 38-kSPS, Analog-to-Digital Converter (ADC) with Programmable Gain Amplifier (PGA) and Voltage Reference", Texas Instruments Data Sheet, (Jul. 2015).

"ADS126x Precision, 5-channel and 10-channel, 40-kSPS, 24-bit, delta-sigma ADCs with PGA and monitors", Texas Instruments Data Sheet, (Jan. 2019), 91 pgs.

Galal, Sherif, "A 32-Channel Front-End for Wireless HID using Inverse-STF Pre-Filtering Technique", IEEE Custom Integrated Circuits Conference, (2010), 4 pgs.

"U.S. Appl. No. 17/138,295, Notice of Allowance dated Jan. 3, 2023", 7 pgs.

"U.S. Appl. No. 17/138,295, 312 Amendment filed Jan. 19, 2023", 3 pgs.

"U.S. Appl. No. 17/138,295, 312 Amendment filed Mar. 21, 2023", 7 pgs.

"U.S. Appl. No. 17/138,295, Corrected Notice of Allowability dated Mar. 29, 2023", 2 pgs.

"U.S. Appl. No. 17/138,295, Non Final Office Action dated Aug. 22, 2022", 7 pgs.

"European Application Serial No. 21216605.2, Response filed Sep. 28, 2022 to Extended European Search Report dated May 16, 2022", 30 pgs.

"U.S. Appl. No. 17/138,295, Response filed Nov. 21, 2022 to Non Final Office Action dated Aug. 22, 2022", 9 pgs.

\* cited by examiner

ADC WITH PRECISION REFERENCE POWER SAVING MODE

TECHNICAL FIELD

This document pertains generally, but not by way of limitation, to power saving and low noise applications for analog to digital converters.

BRIEF SUMMARY

Precise external voltage or current references for analog to digital converters are complex circuits that often require continuous power draw in order to give an accurate digitized output for a given analog input. References cannot be turned on and off quickly. Starting and running a reference circuit can require a large power draw. A system and methods are disclosed that use an external reference for determining a correction or calibration factor, which, in turn can then permit an external low noise supply to be used as a reference bias for performing the analog to digital conversion, which can then be calibrated, corrected, or similarly adjusted in the digital domain. This allows for the external reference standard to be turned off, thereby saving power during the operation of an analog to digital converter device that takes advantage of these systems and methods.

Non-limiting aspects of the invention include the calibration architecture and methodology for determining calibration factors in order to determine the digital output of an analog to digital converter system that avoids needing a reciprocation of the calibration factors. An alternative architecture and methodology that simplifies the analog switching which requires calculation of reciprocal calibration factors in order to determine the digital output of the analog to digital converter system. The incorporation of additional measurements into the calibration to correct for other effects on the system including noise introduced into the system due to temperature or package stress. Each of these non-limiting examples can stand on its own or can be combined in various permutations or combinations with one or more of the other examples.

This overview is intended to provide an overview of subject matter of the present patent application. It is not intended to provide an exclusive or exhaustive explanation of the invention. The detailed description is included to provide further information about the present patent application.

BRIEF DESCRIPTION OF THE SEVERAL VIEWS OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
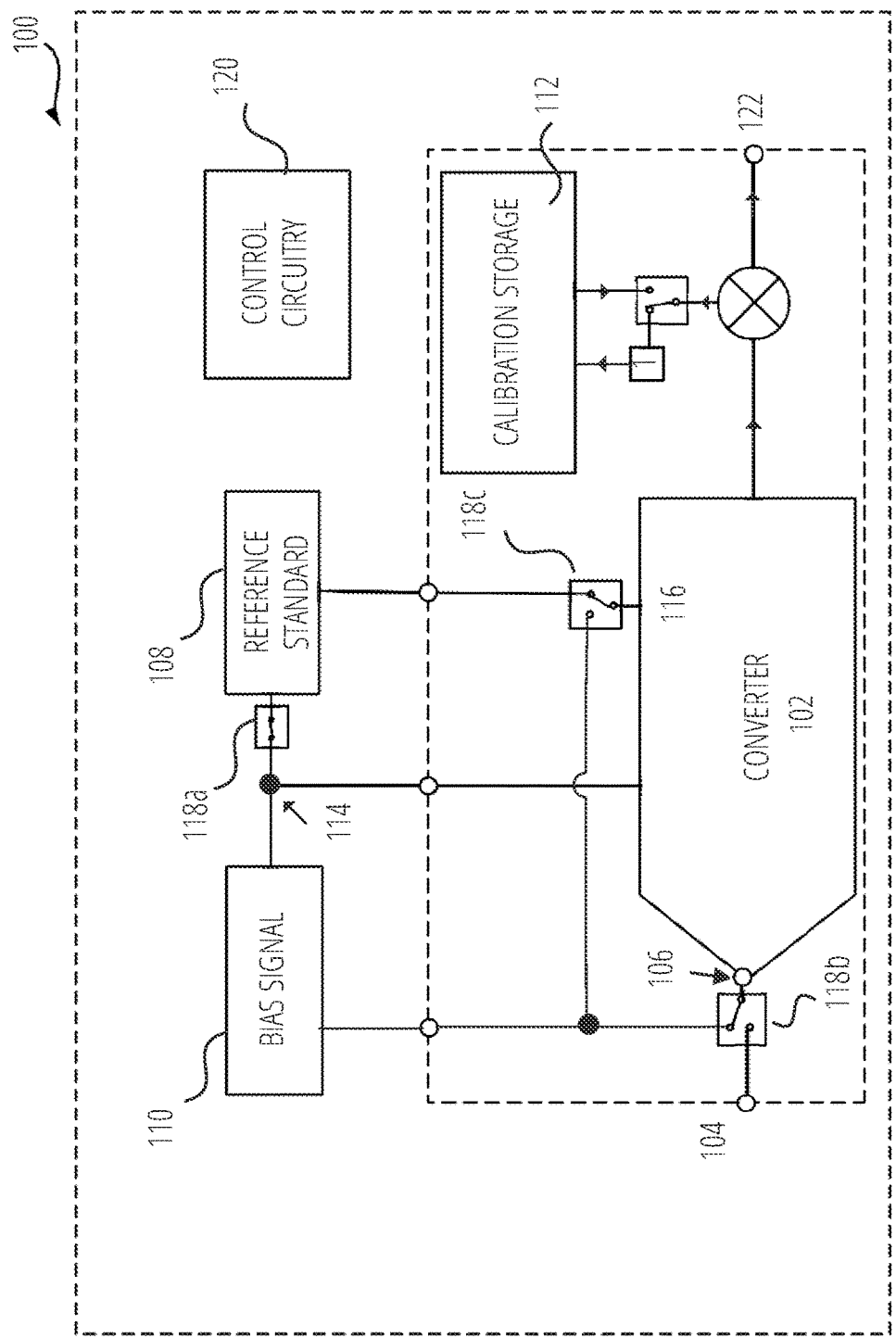
FIG. 1 illustrates a schematic of the ADC in calibration mode.

Analog to digital converters are used to take an analog signal as the input data and convert that data into a digital output. This analog to digital conversion may be done by taking a transformed value of the analog input signal, which is referenced against a stable external reference used for performing the analog to digital conversion. The digital output is proportional to the ratio of the analog input signal over the external reference. The external reference may be a precision reference standard, which is considered to be "precise" and which outputs a signal that is known to the system. A secondary bias, supply, or reference circuit can provide a reference bias that at least has a substantially stable electrical output the exact value of this reference bias may not be known to the system. This configuration allows for the precision reference standard to be powered off to conserve power while using the reference bias as an analog to digital measurement reference. Power is saved when the reference bias uses less power than the reference standard. For example, the reference bias could be an existing bias that is given an additional purpose as reference, or a lower power reference bias. The reference standard only has to be powered on during a calibration mode that uses the reference standard in order to determine an appropriate correction factor. If the reference bias has a slow variation in time the system may need to periodically or recurrently need to be placed back in calibration mode in order to maintain the correct correction factor. This correction factor is used to convert the digital output that was referred to the reference bias into one that is referred to the reference standard. Periodic or recurrent re-calibration of this correction factor may be required to account for slow variation of the reference bias. This takes advantage of the fact that the reference bias, while not precisely known, can be used by the analog to digital converter to determine a value for the digital signal that only needs to be corrected by the correction factor that was determined during the calibration mode. During a calibration mode, a correction factor or correction value is calculated, such as to capture the relationship between the reference bias and the reference standard. In some examples, the system also has the ability to monitor battery/supply health, such as when the system is deriving a reference bias from its battery or power supply.

In some examples, the calculation of linear or non-linear and transient system factors, such as temperature dependencies or mechanical stress, can be accounted for in the calculation of the correction factor that is stored and used by the system. This correction factor can be determined by measuring the signal from a temperature or stress dependent circuitry using an analog to digital converter, and using a digital circuit to calculate the correction factor. The use of such a computational correction factor that takes into account such additional factors can help eliminate the need for analog adders and amplifiers to be included as part of a compensation circuit "upstream" from the analog-to-digital signal converter (ADC). The correction factor can be stored in a calibration storage, and can then be used during normal operating mode, to scale the output voltage. It is appreciated that the digital calculation of the correction factor allows for advanced digital noise attenuation and eliminates errors introduced by analog adders or amplifiers.

In other examples, the external precision reference standard can be replaced by a computational reference standard. This computational reference standard is calculated by taking a linear combination of measurements of electrical signals from one or more temperature and/or stress dependent circuitries. Each signal is measured by an analog to digital converter that uses a reference bias that may not be known to the system. The resulting computational reference standard therefore is also determined with respect to that reference bias. The correction factor equals the reciprocal of the computational reference standard. It is appreciated that this embodiment does not require any analog adders or amplification circuitry, reducing sources of error. Advanced digital noise filtering can be applied to improve precision. It is also appreciated that measurements of the temperature and stress dependent signals can be done sequentially, such circuits can be reconfigured instead of being replicated in order to reuse a reference or sensor. This allows for elimination of matching errors. For example, a computational band-gap reference could be implemented with a single diode, that for each measurement is biased at a different current density.

FIG. 1 illustrates a schematic of the ADC system 100 in a calibration mode. In the calibration mode, the ADC converter 102 takes as an input a reference bias the bias signal circuitry 110 at the system ADC input node 106. Switch 118b is used to control switching between when the ADC system 100 is in calibration mode or, alternatively, in operating mode (described with respect to FIG. 2). Switches 118a-118c can be controlled by control circuitry 120 which can, at particular times, change the system from running in calibration mode to operating mode, either on a set recurrent schedule or when a user of the system sends a command signal to the ADC system 100. In some implementations, the reference bias doesn't need to be sampled for the calibration mode or only once or, for example, if sampled, not sampled more than once per minute or even less often for a reference bias that has a slow drift, such as a slow discharging battery.

When in calibration mode, switch 118b is set to connect the reference bias from the bias signal circuitry 110 to the ADC input node 106. This reference bias output by the bias signal circuitry 110 is a stable source. In some examples, the reference bias output from the bias signal circuitry 110 can be from a battery, capacitor, or any circuitry that outputs a stable signal as an output. To save power, this output must stay stable in time for multiple signal conversions taken by the ADC converter 102. When the bias signal circuitry 110 is also acting as the power supply to the ADC system 100, then the ADC converter 102 is powered by connecting the reference bias through power supply node 114. In some examples, the reference bias is a supply voltage signal coupled to a battery or other power supply node. The ADC converter 102 also includes a measurement reference node 116, which receives a signal from a reference standard 108. Switch 118c is used to control which reference signal is received at the measurement reference node 116 of the ADC converter 102. While in calibration mode switch 118c is in a position to couple a reference signal from the reference standard 108 to the measurement reference node 116 of the ADC converter 102. The reference standard 108 circuitry may include large bypass capacitors that do not allow for fast power cycling such that a high quiescent current can be consumed by reference standard 108 circuitry. The reference standard 108 can be switched out and substituted by a secondary "known" voltage reference, which may be a precision reference or a less precise reference bias from the bias signal circuitry 110. Using this known voltage reference at its measurement reference node 116, the ADC converter 102 can perform an analog to digital conversion that presents a digital output at the output node 122 that is highly calibrated, accurate, and not prone to drifting due to heat or other packaging stresses.

In some examples, the reference standard 108 is left on continuously. However, leaving the reference standard 108 in an "on" state is not ideal for low power applications. In some low power applications of the ADC converter 102, the reference standard 108 is only turned on in periodic or recurrent fashion to use the reference standard 108 to determine a correction factor that can be stored in a calibration storage 112. Since the bias signal circuitry 110 in some examples can also be the power supply for the ADC system 100, the reference standard 108 in some examples can be turned on and off by switch 118a.

The correction factor may be represented mathematically as the ratio of the value at the ADC input node 106 and the value at the measurement reference node 116. In calibration mode, the value of the ADC input node 106 may be represented as a voltage input $V_{in}$, where $V_{in}$ is the voltage from the reference bias $V_{supply}$. Therefore, $V_{in}=V_{supply}$ when in calibration mode. In calibration mode, the input at the measurement reference node 116 is the voltage $V_{ref}$ from the reference standard 108. The correction factor may be represented as the ratio between the voltage input $V_{in}$ and the voltage $V_{ref}$ of the reference standard 108. Therefore, the ratio $$\frac{V_{supply}}{Vref}$$

is stored in the calibration storage 112 as the correction factor. In other examples, these calculations can be done with a current or power input or reference instead of a voltage input or reference.

Figure 2:
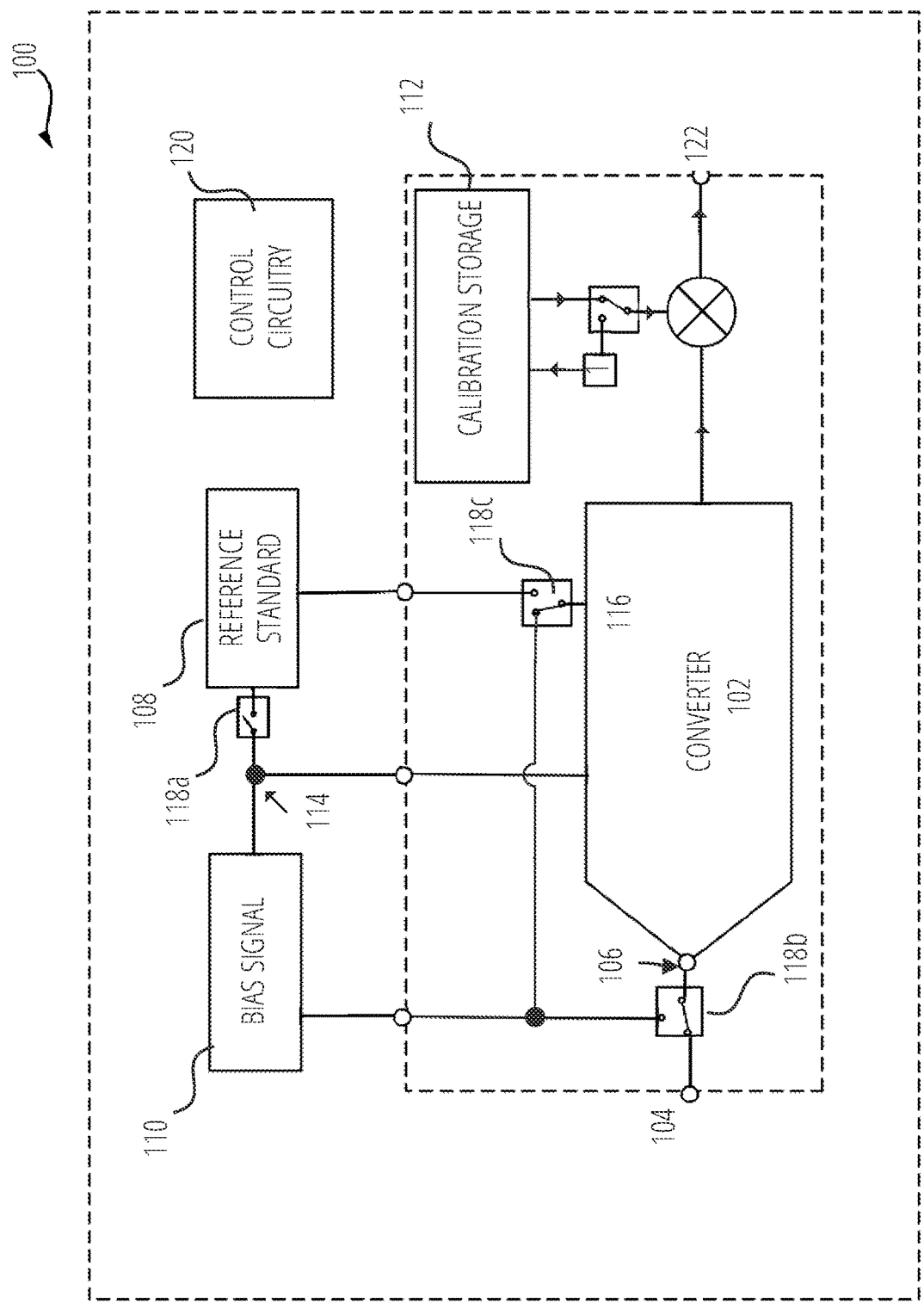
FIG. 2 illustrates a schematic of the ADC in operating mode.

FIG. 2 illustrates a schematic of the ADC system 100 when it is run in operating mode. The ADC converter 102 is powered by connecting the reference bias from the bias signal circuitry 110 through power supply node 114. Once the correction factor is determined and saved within the calibration storage 112, the control circuitry 120 can switch the ADC system 100 from calibration mode to operating mode by reconfiguring the switches 118a-118c. The control circuitry 120 is configured to reduce power or to even turn off the power to the reference standard 108 when the ADC system 100 is run in operating mode. The system can be set up to use the minimum power-cycle frequency (calibration duty cycle) between running the system in calibration mode where the reference standard 108 is turned on and running the system in operating mode where the reference standard 108 is turned off or run in a low power mode. Turning off the reference standard 108 also allows the ADC system 100 the ability to take advantage of ultra-low noise properties of most battery chemistries. Precise supply calibration of the bias signal circuitry 110 is not required.

Switch 118a turns off the power to the reference standard 108. Switch 118c applies the bias signal circuitry 110 to the measurement reference node 116 of the ADC converter 102. Switch 118b is reconfigured to take in an analog input signal at the system input node 104 from an external source attached to the ADC input node 106. In some examples, this may be a voltage signal or a current signal. In some implementations, the voltage input can be sampled at a high rate, such as every nanosecond or microsecond. Since the reference standard 108 is no longer consuming power, when turned off, this lowers the average power consumption of the ADC system 100. The ADC converter 102 takes the correction factor saved in the calibration storage and uses it to correct the result of the ADC converter 102 before outputting the corrected digital signal at the output node 122 of the ADC system 100.

At the output node 122 of the ADC system 100 the output may be mathematically represented as a ratio of the input value over the reference value multiplied by the stored correction factor. The system input node 104 may be a voltage input ($V_{in}$). The input at the measurement reference node 116, in operation mode, is the voltage from the reference bias $V_{supply}$. In some implementations this value can be further corrected by one or more additional scaling factors (full scale value $F_s$). Therefore, applying the correction factor to output of the ADC converter 102 results in digital output value being a factor of known values $V_{in}$ and $V_{ref}$.

$$\text{Output} = \frac{V_{in}}{V_{supply}} \cdot \frac{V_{supply}}{V_{ref}} \cdot F_S = \frac{V_{in}}{V_{ref}} \cdot F_S$$

Where digital computation may be power intensive, this method of calibrating a ADC converter 102 uses less power because it uses only multiplicative scaling to determine the output at the output node 122. The correction factor $$\frac{V_{supply}}{V_{ref}}$$

is determined without any additional calculation.

Figure 3:
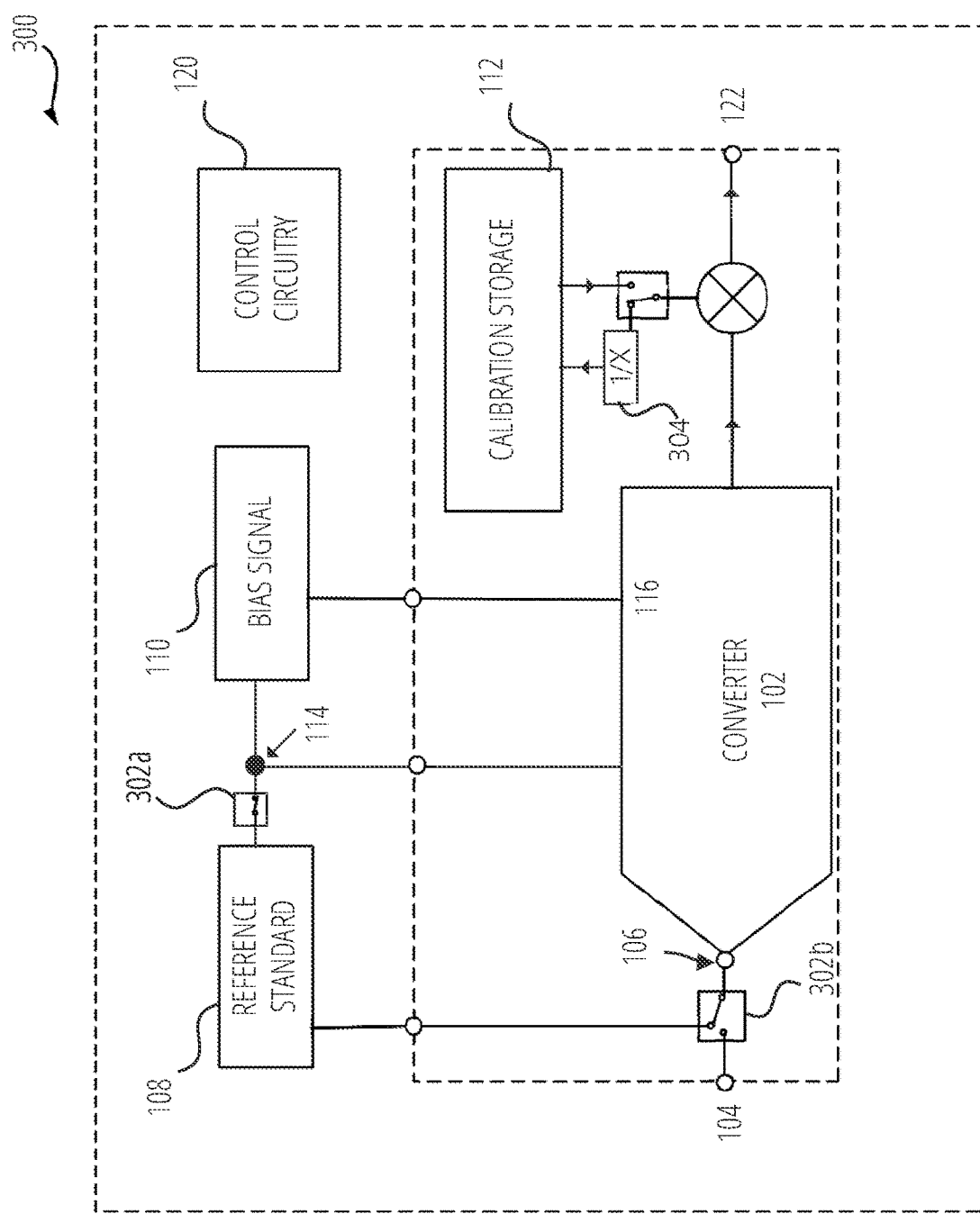
FIG. 3 illustrates an aspect of the subject matter in accordance with an embodiment.

FIG. 3 illustrates an alternative schematic of the ADC system 300. This alternative schematic uses fewer switches, switch 302a and switch 302b than the above discussed ADC system 100. In this alternative schematic, when in calibration mode, the reference standard 108 is connected to the ADC input node 106, such as by switches 302a and 302b. In some embodiments (not pictured) the ADC converter 102, and the reference standard 108 when in calibration mode, are powered by the bias signal circuitry 110. In FIG. 3 the ADC converter 102, the reference standard 108, and the bias signal circuitry 110 are powered by a power source at power supply node 114. When the ADC system 300 is run in calibration mode the control circuitry 120 turns switch 302a on to power the reference standard 108 as well as switch 302b to sample signal from the reference standard at the ADC input node 106 of the ADC converter 102. In one embodiment, the calibration calculation circuitry 304 can be used to find a reciprocal value of the correction factor and then can save the correction factor in calibration storage 112. In another embodiment (not pictured) the reciprocal value may be determined by the calibration calculation circuitry 304 and applied to the digital output during the operating mode, while only the reciprocal of the correction factor is stored in the calibration storage 112 during the calibration mode. In some implementations of the ADC system 300, the reference standard 108 only has to supply a charge during the calibration mode and is not disconnected from the ADC system 300 when it is not in use. Therefore, the system does not have to do any charge balancing after turning off the reference standard 108. The switches can be operated to take in an analog input signal from an external source attached to the input node and to reduce the load on the reference standard 108 during calibration. Therefore, less power overall is used by the ADC system 300.

Just as in the previous implementation, the correction factor may be represented mathematically as the ratio of the value at the ADC input node 106 and the value at the measurement reference node 116. However, in this case, the voltage at the ADC input node 106 can be represented by $V_{in}$ being the voltage from the reference standard 108 $V_{ref}$. Therefore, $V_{in}=V_{ref}$ when in calibration mode. The input at the measurement reference node 116 is the voltage from the bias signal circuitry 110 $V_{supply}$. The correction factor may be represented as the ratio between the voltage input and the voltage of the reference. Therefore the ratio $$\frac{V_{ref}}{V_{supply}}$$

is stored in the calibration storage 112 as the correction factor. To make later calculations easier, the calibration storage 112 may save the reciprocal value of the correction factor $$\frac{V_{supply}}{V_{ref}}.$$

In other examples using ADC system 300, these calculations can be done with current or power inputs or references, as desired.

In the operating mode (not pictured) switch 302b are set to accept an input value from the system input node 104 from an external source. Once the correction factor or correction factor is determined and saved within the calibration storage 112, the control circuitry 120 can switch the ADC system 300 from calibration mode to operating mode by reconfiguring the switch 302a and switch 302b. The ADC system 300 can be set up to use the minimum power-cycle frequency (calibration duty cycle) between running the system in calibration mode, in which the reference standard 108 is turned on, and running the system in operating mode, in which the reference standard 108 is turned off.

Switch 302a turns off the power to the reference standard 108. Switch 302b is activated to take in an analog input signal from an external source attached to the system input node 104. In some examples, this may be an electrical signal such as a voltage signal or a current signal. In some implementations the voltage input can be sampled at a high rate, such as every nanosecond or microsecond. The ADC system 300 takes the reciprocal value of the correction factor saved in the calibration storage 112 to correct the analog to digital conversion result of the ADC converter 102 before outputting the corrected digital signal at the output node 122 of the ADC system 300.

At the output node 122 of the ADC system 300, the output may be mathematically represented as a ratio of the input value (at system input node 104) over the reference value (at measurement reference node 116) multiplied by the stored correction factor. For example, an input voltage value of the ADC input node 106 may be represented as a voltage input $V_{in}$. The input reference value at the measurement reference node 116, in operation mode, is the voltage from the reference bias $V_{supply}$, for example. In some implementations, one or more of these values can be further corrected by one or more additional scaling factors ($F_s$), as needed. Therefore, applying the correction factor to the output of the ADC converter 102 results in the corrected digital output value being a factor of known values $V_{in}$ and $V_{ref}$.

$$\text{Output} = \frac{V_{in}}{V_{supply}} \cdot \frac{V_{supply}}{V_{ref}} \cdot F_S = \frac{V_{in}}{V_{ref}} \cdot F_S$$

This can help allow for one or more additional parameters such as temperature or strain, or both, to be accounted for during calibration. Additional digital computation can be done during the determination of the correction factor at the computational calculation circuitry 408 before storing the correction factor in the calibration storage 112. The correction factor can be understood to be related to the ratio of the stable measurement of the signal from the reference standard 108 over the bias signal circuitry 110. The correction factor is stored in the calibration storage 112. One or more other parameters that represent different package stresses such as temperature or strain, etc., for example, may also be measured in relation to the bias signal circuitry 110. These values may be determined and used for analog to digital conversion correction in a manner such as described below with respect to FIG. 4. The final digital calculation can apply the inverse of the correction factor to the ratio of the input signal over the bias signal circuitry 110. While this approach does calculate an inverse of the correction factor which is stored in the calibration storage 112 before applying the correction factor to the raw digital output signal at the output node 122, where the digital computation is not computationally power intensive, this approach can still help save power.

Figure 4:
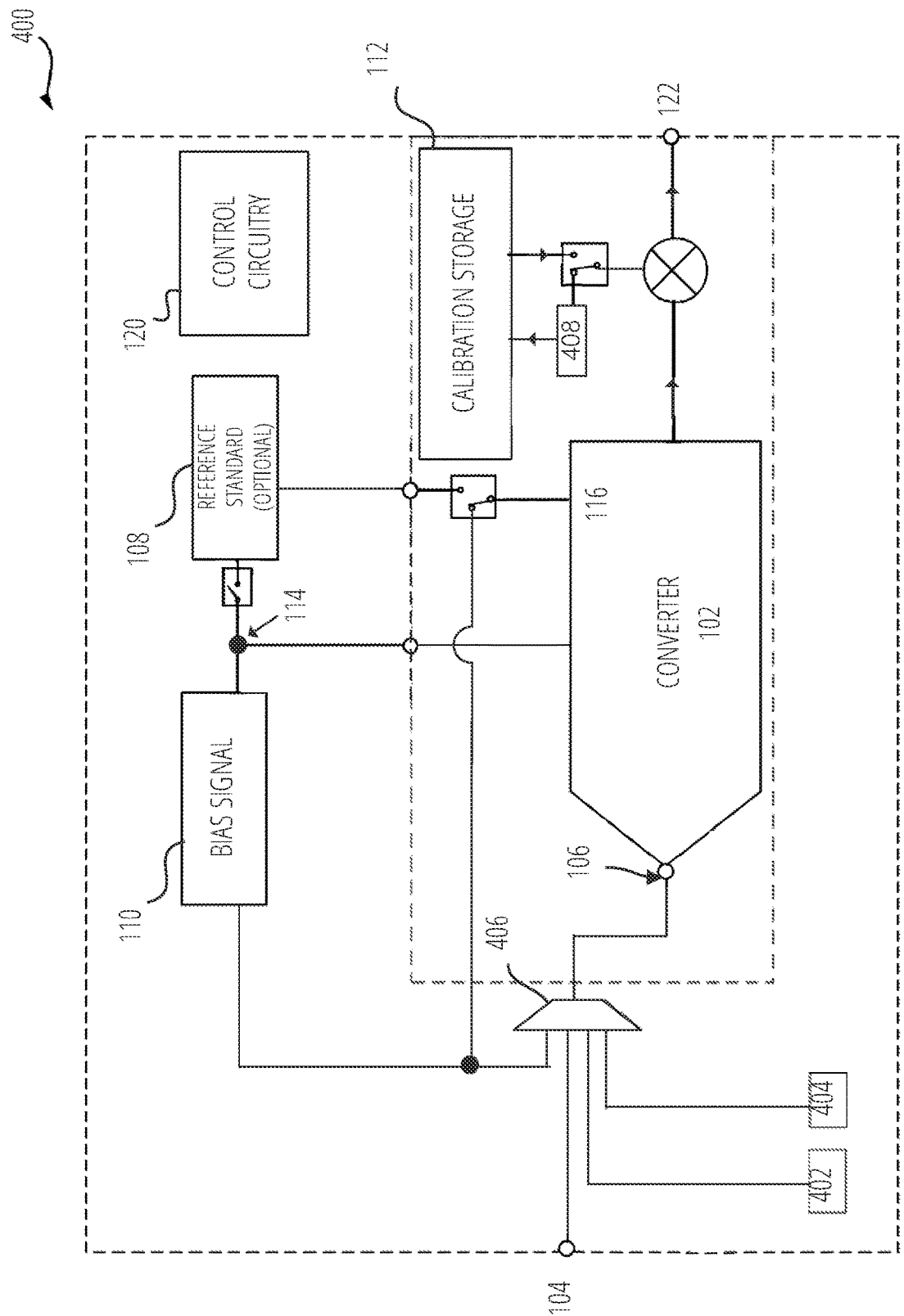
FIG. 4 illustrates an alternative schematic using a computational reference.

FIG. 4. illustrates an alternative schematic of an ADC system 400 using a computationally determined correction factor applied to the raw digital output of the ADC converter 102. This method can be used with one or more of the other methods described above. The correction factor can take into account sensed signals that are due to one or multiple temperature or package stress dependent inputs. The correction factor is calculated, in calibration mode, from these sensed signals and computed values which represent the one or multiple temperature or package stress dependent inputs and saved as a calibration factor that is applied in the digital domain when the system is in operation mode. This can enable a combination of precision reference and precision data converter techniques with minimum overhead. The ADC system 400 as a whole does need to have some degree of stability between calibration cycles in order to make the measurements of an analog input signal for analog to digital conversion. However, even where the ADC system 400 as whole has variations, the correction factor would still be considered accurate so long as the variation in the systems are either slow or well corrected by calibration using the control circuitry. Slow variations in some examples can be on the order of seconds. These slow variations can be also handled using low pass or other filter circuitry in the system such as to attenuate variation in the reference standard output signal, such as based on a signal threshold. The reference standard circuitry includes the low pass or other filter circuitry to attenuate variation in the reference standard signal based on the indicated signal threshold in order to account for the temperature or stress dependent input. Adding a digital filter enables attenuation of reference noise and using a median filter it can also eliminate telegraph noise. Therefore, the system can take full advantage of a low-noise battery reference. This can be done by performing a reference computation of a series of filters attenuated by a correction factors, removing the noise from the system.

In FIG. 4 the ADC converter 102, the reference bias, and the reference standard are powered by a power source at the power input node at 114. In some embodiments (not pictured) the ADC converter 102 is powered by connecting the reference bias which is output from the bias signal circuitry 110 through measurement reference node 116. While only two package stress dependent inputs, 402 and 404, are shown, the system can have many others that can be considered and corrected. In some examples these package stress dependent inputs such as 402 and 404 can input non-constant observations such as from one or more diodes, resistance temperature detectors (RTDs), stress sensors, or other similar devices. While two such devices are represented in FIG. 4, the system can include more such inputs. The package stresses can be handled in the analog domain before inputting the signal to the system input node 104 into the ADC converter 102 of the ADC system 400. However, doing so can increase the power consumption of the system. Therefore, there are benefits to having a computed calibrated reference that computes a reference value that applies the various package stress inputs 402 and 404 as well as reference standard (not shown) which is input at measurement reference node 116. Then, the control circuitry 120 can be used to control switches to select which signal is used to generate the reference standard signal (which may also be referred to as the computational correction factor) based on a sensed signal and one or more computed values. FIG. 4 shows this as using input multiplexer 406 which acts as a control switch however other known switching circuit designs can be used. The computation correction factor is calculated digitally in the computational calculation circuitry 408 before being stored in calibration storage 112.

The computational correction factor may be represented mathematically as the ratio of the value at the ADC input node 106 and the bias signal circuitry 110, which the control circuitry 120 can switch between. The corresponding computational correction factors can be saved in the calibration storage as needed for use with the particular signal value at the measurement reference node 116. In an example, the calibration mode value of the ADC input node 106 may be a voltage input ($V_{in}$). The voltage input $V_{in}$ can represent the voltage from the package stress dependent input 402 and 404 $V_{f1}$ through $V_{fn}$, respectively. While only two package stress dependent inputs 402 and 404 are being considered within the system in FIG. 4, more can be considered. In an example, the signal input at the measurement reference node 116 is the voltage from the reference bias $V_{supply}$. The correction factor may be represented as the ratio between the voltage at the system input node 104 and the voltage of the reference at measurement reference node 116. Therefore, the ratio $$\frac{V_{in}}{Vsupply}$$

is stored in the calibration storage 112 which may include multiple correction factors (such as C1, . . . , Cn) to determine a composite computation correction factor. In other examples these calculations can be done with current or power input or reference voltages, as desired.

$$\text{Computational Calibration} = \frac{V_{in}}{Vsupply} = C_1 \frac{V_{f1}}{V_{supply}} + \ldots + C_n \frac{V_{fn}}{V_{supply}}$$

When in operating mode, a reciprocal value of the composite computational correction factor can be determined in the digital domain and applied to the raw digital output signal to provide a corrected digital output signal. The corrected digital output signal is then output at the output node 122.

$$\text{Output} = \frac{V_{in}}{V_{supply}} \cdot \frac{V_{supply}}{V_{ref}} \cdot F_S = \frac{V_{in}}{V_{ref}} \cdot F_S$$

While the above implementation need not use a reference standard 108, a reference standard can be applied similarly to the approaches described above. This may have the advantage of not needing to find the reciprocal value of the computational correction factor before applying the computational correction factor to the raw digital output to get the corrected digital output at the output node 122.

The above description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A system for processing an electrical signal, the system comprising:
   analog-to-digital (ADC) signal converter circuitry including an ADC input node, an ADC output node, and an ADC reference node, the signal converter circuitry to receive an analog signal at the ADC input node and to generate, responsive to the analog signal and based on a signal received at the ADC reference node, a digital signal at the ADC output node;
   bias signal circuitry to generate a reference bias;
   reference standard circuitry to generate a reference standard signal; and
   control circuitry to operate the system in a first mode and in a second mode, wherein:
      in the first mode, the control circuitry is configured to couple the reference bias to the ADC input node and to couple the reference standard signal to the ADC reference node to generate a digital measurement of the reference bias using the reference standard signal as a reference at the ADC reference node; and
      in the second mode, the control circuitry is configured to couple the analog signal to the ADC input node and the reference bias to the ADC reference node to generate a measurement of the analog signal using the reference bias as a reference at the ADC reference node.

2. The system of claim 1, further comprising:
   storage circuitry coupled to the ADC output node and configured to store data indicative of the digital measurement of the reference bias using the reference standard signal as a reference at the ADC reference node.

3. The system of claim 2, wherein the control circuitry is configured to adjust the measurement of the analog signal using the stored data indicative of the digital measurement of the reference bias to compensate for variation in the reference bias with respect to the reference standard signal.

4. The system of claim 1, wherein the control circuitry is configured to recurrently switch the system between operating in the first mode and operating in the second mode.

5. The system of claim 1, wherein the control circuitry is configured to turn off or reduce power to the reference standard circuitry in the second mode.

6. The system of claim 1, wherein the control circuitry includes switching circuitry to:
   in the first mode, couple the reference bias to the ADC input node; and
   in the second mode, couple the analog signal to the ADC input node.

7. The system of claim 1, wherein the control circuitry includes switching circuitry to:
   in the first mode, couple the reference standard signal to the ADC reference node; and
   in the second mode, couple the reference bias to the ADC reference node.

8. The system of claim 1, wherein the reference standard circuitry includes sensing circuitry to generate a sensed signal that is indicative of an environmental condition.

9. The system of claim 1, wherein the reference bias is a supply voltage signal coupled to a battery or other power supply node.

10. The system of claim 9, wherein the reference standard circuitry includes computational circuitry to generate the reference standard signal based on one or more sensed signals and one or more computed values.

11. The system of claim 9, wherein the reference standard circuitry includes filter circuitry to attenuate variation in the reference standard signal.

12. The system of claim 9, wherein the ADC signal converter circuitry includes at least one of a diode, a stress sensor, a resistance temperature detector, or a temperature sensor.

13. A system for processing an electrical signal, the system comprising:
  analog-to-digital (ADC) signal converter circuitry including an ADC input node, an ADC output node, and an ADC reference node, the signal converter circuitry to receive an analog signal at the ADC input node and to generate, responsive to the analog signal and based on a signal received at the ADC reference node, a digital signal at the ADC output node;
  bias signal circuitry to generate a reference bias;
  reference standard circuitry to generate a reference standard signal; and
  control circuitry to operate the system in a first mode and in a second mode, wherein:
  in the first mode, the control circuitry is configured to couple the the reference bias to the ADC input node and couple the reference standard signal to the ADC reference node to generate a digital correction factor measurement; and
  in the second mode, the control circuitry is configured to couple the analog signal to the ADC input node and to couple the reference bias to the ADC reference node to generate a measurement of the analog signal at the ADC input node using the reference bias as a reference at the ADC reference node and using a reciprocal of the digital correction factor to adjust an analog to digital conversion value of the analog signal at the ADC output node.

14. The system of claim 13, further comprising:
  storage circuitry coupled to the ADC output node and configured to store data indicative of a digital measurement of the reciprocal of the reference bias at the ADC reference node.

15. The system of claim 13, wherein the control circuitry is configured to recurrently switch the system between operating in the first mode and operating in the second mode.

16. The system of claim 13, wherein the control circuitry is configured to turn off or reduce power to the reference standard circuitry in the second mode.

17. A method of processing an electrical signal using an analog-to-digital converter (ADC) having an ADC input node, an ADC output node, and an ADC reference node, the method comprising:
  receiving an analog signal at the ADC input node;
  generating at the ADC output node a digital signal, wherein the digital signal is responsive to the analog signal and based on a signal received at the ADC reference node;
  generating, via a bias signal circuit, a reference bias;
  generating, via a reference standard circuit, a reference standard signal; and
  operating the converter in a first mode and in a second mode, wherein:
  in the first mode, the reference bias is coupled to the ADC input node and the reference standard signal is coupled to the ADC reference node to generate a digital measurement of the reference bias using the reference standard signal as a reference at the ADC reference node; and
  in the second mode, an input analog signal is coupled to the ADC input node and the reference bias is coupled to the ADC reference node to generate a measurement of the analog signal using the reference bias as a reference at the ADC reference node.

18. The method of claim 17, wherein the method further comprises recurrently switching between operating in the first mode and operating in the second mode.

19. The method of claim 17, wherein the reference bias is a supply voltage signal coupled to a battery or other power supply node; and
  further comprising:
  generating the reference standard signal based on a sensed signal and one or more computed values.

20. The method of claim 17, further comprising:
  turning off or reducing power to the reference standard circuit in the second mode.

* * * * *